SEMICONDUCTOR CONTROL CIRCUIT

Filed Oct. 26, 1967

INVENTOR
EDWARD D. PADGETT
BY Harry M. Saragovitz, Edward J. Kelly, Herbert Berl & S. Dubroff
ATTORNEYS United States Patent Office 3,539,822

Patented Nov. 10, 1970

3,539,822
SEMICONDUCTOR CONTROL CIRCUIT

Edward D. Padgett, Morristown, N.J., assignor to the United States of America as represented by the Secretary of the Army Filed Oct. 26, 1967, Ser. No. 678,462
Int. Cl. H03k 17/00
U.S. Cl. 307—252 5 Claims

ABSTRACT OF THE DISCLOSURE

A control circuit having a conditioned amplifier to provide phase-coded pulses to four-layer semiconductor devices to obtain reliable scheduled initiation of the devices to their conduction states. A conditioning network is provided to cancel out the effects that voltage variations would have on the conduction state of the semiconductor devices.

Figure 1:
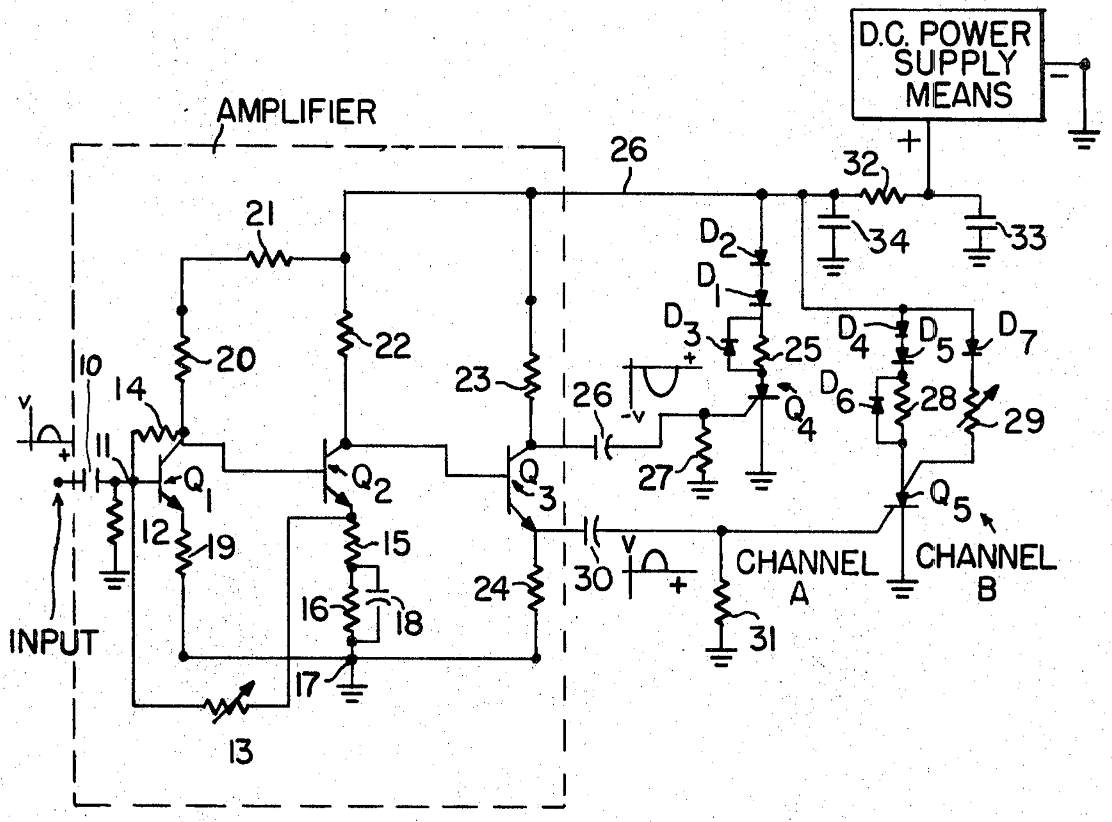

The invention described herein may be manufactured, used, and licensed by or for the Government for governmental purposes without the payment to me of any royalty thereon.

The present invention relates to direct coupled semiconductor control circuits, and particularly, to control circuits provided with a necessary conditioning network to obtain reliable scheduled firing or initiation to the conduction state of semiconductor (PNPN or NPNP) devices of the step recovery or charge storage type. Presently, silicon-controlled rectifiers and silicon-controlled switches are employed for purposes of fuzing, safing, arming and firing detonating systems and adaption kits in missiles for activation of warheads on a programmed schedule.

The main disadvantages of such use of semiconductor devices is that they are susceptible to being fired or turned on by unwanted voltage variations or random signals. The semiconductor control circuit of the present invention is directed to solving this problem to a degree no existing device has been able to accomplish, and is found to substantially eliminate response to random signals, or changes in voltage with time variations occurring at the electrodes of the semiconductor devices, which can cause unwanted firing of the missile adaption kits or other like devices.

The present invention provides greater reliability in applications wherever fidelity of control and operational precision are essential such as in the above-mentioned fuzing, safing, arming and firing applications for adaption kit circuits and the like, and as detectors and replacements for mechanical timers for the activation of missile warheads during flight.

In general, the inventive apparatus comprises an improved pulse conditioned amplifier with a conditioning network and control circuit adapted to overcome the above-mentioned disadvantages of prior apparatus of this type and to provide reliable scheduled initiation of specialized four-layer semiconductor junction devices therein into the conduction state.

The inventive apparatus includes among its operational elements, a pulse-conditioned amplifier consisting preferably of three direct-coupled transistors of the low-noise and moderate-gain type.

The output stage of the amplifier acts as a phase inverter to provide a plurality of coded pulses of suitable polarity, magnitude and width to accomplish the firing of the semiconductor devices referred to above.

The proper pulses are applied through directly-coupled means to the control electrodes of PNPN or NPNP semiconductor devices to cause switching from the OFF to the ON states, that is, the conduction states of the devices. At least one of the pulses is coded negative in polarity and at least one other is coded positive.

A negative pulse is applied directly to the control gate of a silicon-controlled rectifier, through a capacitor and load resistor network. A positive pulse is applied directly to the cathode gate of a silicon-controlled switch, through another capacitor and load resistor network. The excitation caused by the applied pulses results in the triggering of the semiconductor devices into their conduction states.

Figure 2:
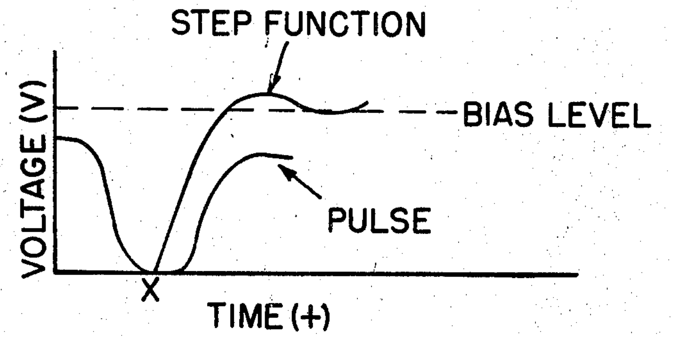

In the drawing, FIG. 1 is a schematic circuit diagram of a presently preferred embodiment of the invention utilizing step-recovery or charge-storage type semiconductor devices; and FIG. 2 is a graph showing the formation of a step function when a step-recovery or charge-storage type semiconductor device of FIG. 1 is triggered on.

The invention may be more fully understood by recourse to the drawing, wherein like reference numerals and letters apply to like parts throughout. Referring now to FIG. 1 of the drawing, a control circuit is shown for the firing of two semiconductor load means denoted as channel A and channel B, comprising a SCR and a SCS device respectively.

The conditioned amplifier of the present preferred embodiment, shown inclosed in dotted lines in FIG. 1, comprises three direct-coupled transistors, $Q_1$, $Q_2$, and $Q_3$.

The input terminal of the amplifier, which is provided with a positive going pulse as shown, is connected to a capacitor 10 through a junction point 11 to the base of transistor $Q_1$. The capacitor 10 is also connected through a resistor 12 to a bias potential reference point such as circuit ground. A variable resistor 13 is connected from the junction point 11 to the emitter of second stage transistor $Q_2$. A resistor 14 is also connected from junction point 11 to the collector of the transistor $Q_1$ to provide a proper base bias therefore. The resistors 15 and 16 are connected in series from the emitter of the transistor $Q_2$ through a junction point 17 to the circuit ground, with the resistor 16 being shunted by a capacitor 18.

The resistors 12, 13, 15 and 16 provide a conditioning network for the semiconductor control circuit which will be more fully described with the operation of the entire circuit.

The collector of each of the first two transistors, $Q_1$ and $Q_2$, is connected to the base of the next stage transistor. In other words, the collector of $Q_1$ is connected to the base of $Q_2$ and the collector of $Q_2$ is connected to the base of $Q_3$.

The emitter of first stage transistor $Q_1$ is connected through a resistor 19 to the junction point 17 and ground. The collectors of $Q_1$, $Q_2$ and $Q_3$ are all connected to a positive voltage supply line 26 of a DC power source through the resistor 20 and 21, 22 and 23, respectively. The emitter of $Q_3$ is connected to the junction point 17 through the resistor 24.

The control circuits include channel A and channel B, each having an NPNP or a PNPN semiconductor device therein. Channel A is shown with a silicon-controlled recifier $Q_4$ in its circuit, and channel B is shown having a silicon- controlled switch $Q_5$ in its circuit. The anode of SCR $Q_4$ is connected through the resistor 25 and the diodes $D_1$ and $D_2$ to the voltage supply line 26. The resistor 25 is shunted by a diode $D_3$. The cathode of the SCR $Q_4$ is connected to circuit ground. The cathode gate of the SCR $Q_4$ is connected through a capacitor 26 to the collector of transistor $Q_3$ and through a resistor 27 to ground.

The anode of SCS $Q_5$ is connected through a resistor 28 and the diodes $D_4$ and $D_5$ to the voltage supply line 26. The resistor 28 is shunted by a diode $D_6$. The anode gate of the SCS $Q_5$ is also connected to the supply line 26 through a variable resistor 29 and a diode $D_7$. The cathode gate of the SCS $Q_5$ is connected to the emitter of the transistor $Q_3$ through a capacitor 30 and through a resistor 31 to ground.

The positive side of the DC power supply means, as indicated, is connected to the supply line 26 through a resistor 32 and through a capacitor 33 to ground. The power supply is also connected to ground through the resistor 32 and a capacitor 34. This provides an initial ripple-smoothing filter for the direct-current operating voltage between the positive supply lead 26 and ground, which must be steady and free from spurious peaks and fluctuations.

In the operation of the control circuit of FIG. 1, the resistor 13 is shown as a variable resistor for purposes of explanation, since it is adjusted to establish for the entire circuit a threshold value of voltage from the DC power supply in order to perform certain functions. The threshold value is a voltage below which the PNPN or NPNP devices $Q_4$ and $Q_5$ will not fire. This has the advantage of introducing a valuable safety feature which prevents the circuit from functioning if the supply voltage falls below or never reaches a predetermined value or level. The value of the resistor 13 is also varied to obtain a smoothing or concelling out of any spurious voltages that may appear or of any voltage changes with time properties that would otherwise inherently cause random firing, or turning on of the semiconductor devices.

The actual entire conditioning network needed to achieve the last-mentioned functions consists of the resistors 12, 13, 15 and 16, as previously referred to. It will be noted that the resistor 15 in the emitter circuit of transistor $Q_2$ is not bypassed by a capacitor, while resistor 16 in the same circuit is shunted by the capacitor 18, which may be of a fairly high value, for example, such as 22 microfarads or greater. This unique configuration achieves a reduction in the number of capacitors that otherwise would be needed for the proper circuit functioning, since no bypass capacitors are needed in the emitter circuits of the transistors $Q_1$ and $Q_3$.

The unbypassed resistor 15 allows for degeneration through the resistor 13 which is connected to the base electrode of the transistor $Q_1$. This has the advantages of reducing noise, aiding the smoothing and cancelling out process previously referred to, and permitting the formation of electric pulses of the necessary form and polarity. The presence of the resistor 12 provides improced circuit stability and also provides the necessary pulse-shaping capability over the desired operating temperature range of about −65° C. to about +80° C.

The above considerations permit the choice of a small value of resistance for the resistor 19, for example, of about 60 to 100 ohms. The resistor 14 provides for the proper base bias of the transistor $Q_1$ to establish on operating point, which is simply a conventional consideration. The output voltage pulse from the collector of $Q_1$ is developed across the resistor 20 which is of a relatively high value, thereby to permit the base electrode of the second transistor $Q_2$ to be directly coupled to the collector of the transistor $Q_1$ to obtain a proper bias.

The amplified pulse from the transistor $Q_2$ is developed across the resistance 22, which is of a relatively high value as above noted. The base of the transistor of $Q_3$ can be directly connected to the collector of the transistor $Q_2$ to obtain a satisfactory operating condition. The third semiconductor stage is employed as a phase invertor to provide at least two output pulses at least one of which is positive in polarity, while at least one other is negative in polarity.

If the input signal to the base of $Q_1$ is a positive going pulse of about 70 microseconds in duration and about 16 millivolts in amplitude, the outputs of the third stage as seen by a resistive load, will be as follows: The output pulse from the collector of the transistor $Q_3$, as seen by the resistor 27, which can be approximately 5,000 ohms, will be a negative-going pulse of about 11 volts in magnitude and about 70 microseconds in width. Another output from the third stage, here the emitter of the transistor of $Q_3$, will be a positive-going plulse of about 1.1 volts in magnitude and about 70 microseconds in width, as seen across resistor 31, which can be approximately 1,000 ohms.

The two above-mentioned output voltages are applied to the cathode gates of semicondpuctor devices $Q_4$ and $Q_5$, as previously shown. An SCR or SCS device of suitable geometry and possessed with a desirable step recovery or charge storge characteristic can be fired reliably, and preconditioned by a negative or positive going output pulse of suitable amplitude, width, and shape, such as described above. If the geometry and electrical characteristics of the semiconductor device are satisfactory the negative (positive) excitation causes a depletion of minority carries at one of the junctions of the device. The result is a rapid current rise. This quick rising current (transistion or step from one level to another in a very short time) causes a significant voltage change in the junction to which the gate electrode is affixed, which in turn causes this particular type of device to be triggered on, that is, switched to its conduction state. Stated simply, at some point in time the negative (positive) excitation depletes the carries in the region of one of the semiconductor junctions. The resulting current rises sharply, and this sharp transistion with time causes a voltage change of sufficient magnitude (in the present example, estimated to be from 3 to 8 volts per microsecond) that triggers the PNPN (NPNP) device from the OFF to the ON state. This property can also be used, on proper application, to trigger the device from the ON to the OFF state.

Referring now to FIG. 2, the step function referred to above is shown in graphical form. Part of the negative pulse is shown by the light line or curve, while the step function is shown by the heavier line or curve. At some point in time, depending on the bias level established or available, charges in the region of one of the junctions suddenly become depleted. As a result, current flow is very heavy for a short time, and a rapid transition occurs. As can be seen from the graph, the curves being drawn from the zero level, a step function has been formed, with the rising or leading portion flattening out at the amount of bias available or supplied. The point $x$ in time shown on the graph corresponds to the transition point, the voltage and current being so fast, the function appears as a step. On application of the scheduled pulse, the device is caused to go from cutoff to full on in a very short time.

With resistor 13 set at or adjusted to a predetermined value, the conditioning network in association with the pulse amplifier establishes a threshold value of DC supply voltage below which neither channel A nor channel B will fire. This introduces a desirable safety feature or factor. By way of example, if the resistor 13 is set at a value of 100,000 ohms, this will establish a threshold value of about 31 volts at room temperature. This means that upon application of scheduled pulses the silicon-controlled rectifiers and silicon-controlled switches will fire at supply voltages greater than 31 volts DC, but will not fire at voltages less than 31 volts. A test at a high temperature, about 76° C.; indicated that the threshold value was about 25½ volts DC for the resistor 12 set at 100,000 ohms.

With the resistor 13 set at the above indicated value and with the previously mentioned designated values of the resistors 12, 15 and 16, there was found to be no random firing of the semiconductor devices from any voltage variations in the circuit or any spurious signals, since these items were smoothed out or cancelled by the circuitry. Nor were there any premature firing of the semiconductor devices when the supply voltage was turned on and thereafter changed from zero to 40 volts in less than 15 milliseconds. Here again the circuitry smooths or cancels any spurious voltages that might be produced as the supply voltage changes. Without this particular systems approach, the above supply voltage changes would have previously caused random, unwanted and premature firing of the semiconductor devices.

At pulse levels sufficient to cause firing of the semiconductor devices denoted, the output pulses at triggering are of a much longer duration, that is much greater than one thousand microseconds, thereby providing the holding current needed to keep the semiconductor devices in the ON state.

The semiconductor devices, together with the resistors 28 and 29 in the anode circuits, are used to simulate the actual load circuits provided in fuzes and adaption kits used in missile warheads. The small diodes $D_1$ to $D_7$ in the supply leads of the semiconductor devices are used to achieve additional isolation, to reduce leakage currents and to achieve greater high temperature operation, which in the present described circuit is above 80° C.

While the invention has been shown and disclosed with reference to a control circuit with predetermined values and configurations, it is obvious that the values of resistors can be changed and certain modifications can be made in the circuit, as for example, resistors 27 and 31 may readily be replaced by transformers to achieve the required polarity reversals. Also, the transistor $Q_3$ may be replaced by a four-electrode device (with dual emitter, dual base, or dual collector) to provide additional output connections. This would provide signal output for an additional number of semiconductor load circuits which might be necessary for the proper functioning of a missile in flight.

I claim:

1. A control circuit comprising:

a first transistor having first base, collector and emitter electrodes;

a second transistor of the same conductivity type as said first transistor having second base, collector and emitter electrodes;

a third transistor of the same conductivity type having third base, collector and emitter electrodes;

means connected with the first, second and third emitter electrodes for applying a ground potential thereto;

means conductively connecting the first and second collector electrodes to the second and third base electrodes respectively;

signal input means connected for applying a signal pulse to said first base electrode, having an amplitude and polarity to render said first transistor conductive;

a silicon-controlled rectifier having first anode, cathode and cathode gate electrodes;

a silicon-controlled switch having second anode, cathode, anode gate and cathode gate electrodes;

means including a positive direct-current power supply line connected with said first and second anode and said anode gate electrodes;

means connecting said first and second cathode electrodes with said ground potential means;

means connecting said third collector electrode to said first cathode gate electrode for rendering said silicon-controlled rectifier conductive in response to a negative pulse therefrom;

means connecting said third emitter electrode to said second cathode gate electrode for rendering said silicon-controlled switch conductive in response to a positive pulse therefrom, said positive and negative pulses issuing simultaneously from said third transistor;

and a variable resistor connected between said first base and said second emitter electrodes, said resistor being adjusted in value to establish a threshold value of direct-current power supply voltage below which said silicon-controlled rectifier and switch cannot be rendered conductive.

2. A control circuit as defined in claim 1, wherein said signal input means includes a resistor connected between said first base electrode and said ground potential means, and wherein the ground connecting means for said second emitter electrode is a first and second resistor connected in series with a capacitor shunting said second resistor, thereby to permit said variable resistor, together with the input resistor and first and second resistors to operate to effectively cancel spurious voltages and voltage variations tending to cause either of said silicon-controlled rectifier and switch to be rendered conductive.

3. A control circuit for eliminating random and unwanted firing of four-layer semiconductor devices used in adaption kits for missile fusing, safing, arming and firing other like devices, comprising:

first, second and third transistors of the same conductivity types each having base, emitter and collector terminals, said transistors being normally nonconductive;

a first bias potential terminal;

means connecting said emitter terminals to said first bias potential terminal, said last named means including an unbypassed resistor connected between the emitter of said second transistor and said bias potential terminal;

means conductively connecting said first and second transistor collector terminals to said second and third transistor base terminals respectively;

means including a resistor connected to apply a positive input signal of predetermined amplitude and wave-shape to said first transistor base to render said transistor conductive, whereby the change in potential at the collector terminal of the first transistor causes the second transistor to become conductive whereupon the change in potential at the collector terminal of the second transistor causes the third transistor to become conductive;

a second bias potential terminal;

a silicon-controlled rectifier having anode, cathode and cathode gate terminals, said rectifier normally being nonconductive;

means including diodes and resistors connecting said rectifier anode and said switch anode and anode gate to receive said second bias potential terminal;

means connecting said rectifier and switch cathodes to receive said first bias potential;

means including a resistor for connecting said third transistor collector terminal to said rectifier cathode gate terminal for rendering said rectifier conductive in response to a negative change in potential at said third transistor collector terminal;

means including a resistor connecting said third transistor emitter terminal to said switch cathode gate terminal for rendering said switch conductive in response to a positive change in potential at said third transistor emitter terminal, said rectifier and said switch thus being simultaneously rendered conductive.

4. A control circuit as defined in claim 3, wherein a resistor is connected from the base terminal of said first transistor to the emitter terminal of said second transistor to establish a threshold value for said second bias potential, whereby said rectifier and switch are maintained nonconductive in response to a reduction in the value of said second bias potential below said threshold value, and wherein said last named resistor, second transistor emitter resistor and said signal input resistor operate to cancel spurious voltages and voltage variations tending to cause either of said rectifier and switch to be rendered conductive.

5. A control circuit, comprising in combination, first, second and third transistors of the same conductivity types, said transistors being directly coupled and having the collectors of the first and second transistors connected to the bases of the second and third transistors respectively, the base of said first transistor providing a terminal connection for input signals and the emitter and collector of said third transistor providing terminal connections for output signals of opposite polarity;

a silicon-controlled rectifier having the gate cathode connected to the collector of said third transistor for rendering said rectifier conductive in response to a negative output signal;

and a silicon-controlled switch connected in parallel with said rectifier and having the gate cathode connected to the emitter of said third transistor for rendering said switch conductive in response to a positive output signal, said rectifier and said switch thus being simultaneously rendered conductive.

References Cited

UNITED STATES PATENTS 3,109,971 11/1963 Welch et al. ______ 307—252 XR

FOREIGN PATENTS 940,306 10/1963 Great Britain.

STANLEY T. KRAWCZEWICZ, Primary Examiner

U.S. Cl. X.R.

307—284, 305